United States Patent
Xiao et al.

(10) Patent No.: US 8,213,145 B2
(45) Date of Patent: Jul. 3, 2012

(54) OUTPUT DRIVER PROTECTION

(75) Inventors: Xin Xiao, Folsom, CA (US); David W. Cline, Elk Grove, CA (US); Chuc K. Thanh, Davis, CA (US)

(73) Assignee: Intel Corporation, Santa Clara, CA (US)

( * ) Notice: Subject to any disclaimer, the term of this patent is extended or adjusted under 35 U.S.C. 154(b) by 381 days.

(21) Appl. No.: 12/643,843

(22) Filed: Dec. 21, 2009

(65) Prior Publication Data

US 2011/0149456 A1 Jun. 23, 2011

(51) Int. Cl.
*H02H 3/20* (2006.01)
*H02H 9/04* (2006.01)
(52) U.S. Cl. ...................... 361/91.5; 361/91.1
(58) Field of Classification Search .................. 361/91.5
See application file for complete search history.

(56) References Cited

U.S. PATENT DOCUMENTS

| 6,246,555 | B1 * | 6/2001 | Tham | 361/18 |
| 7,230,410 | B1 * | 6/2007 | Jordan | 323/313 |
| 7,276,888 | B2 * | 10/2007 | Thiele et al. | 323/282 |

* cited by examiner

*Primary Examiner* — Dharti Patel
(74) *Attorney, Agent, or Firm* — Schwabe, Williamson & Wyatt, P.C.

(57) ABSTRACT

Embodiments of an output driver comprising a switching module configured to multiplex a protection transistor between a protection mode and a current mirror mode are disclosed herein. The output driver may operate at high speed with voltages above a maximum threshold voltage specification for the output driver. Additional variants and embodiments may also be disclosed and claimed.

20 Claims, 4 Drawing Sheets

OUTPUT DRIVER PROTECTION

TECHNICAL FIELD

Embodiments herein relate to the field of integrated circuits, and, more specifically, to integrated circuits with electrical overstress protection.

BACKGROUND

The combination of restrictive maximum voltage limits for various integrated circuits, and the high speed and power supply voltages required by various devices may present challenges to output driver design. For example, a thin-gate transistor of an output driver may have a maximum voltage threshold for its terminals, $V_{gd}$, $V_{gs}$, $V_{ds}$, and/or $V_{gb}$. The device coupled to the output driver may have a power supply voltage above this threshold. Consequently, the transistors may become electrically overstressed ("EOS") due to their terminal voltages exceeding the maximum voltage threshold.

Protection transistors may be utilized to protect against the output driver experiencing EOS damage. However, protection transistors may increase the capacitance of the output driver, thereby impacting the ability of the output driver to perform at high speed.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF DISCLOSED EMBODIMENTS

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous.

In various embodiments, methods, apparatuses, and systems for multiplexing a protection transistor between a protection mode and a current mirror mode are provided. The various modes of the protection transistor may enable the protection transistor to operate continually in a saturation region while protecting the integrated circuits from damage caused by electrically overstressing components. In various embodiments, maintaining the protection transistors in a saturation region may lower an output capacitance associated with the integrated circuit. As the output capacitance is lowered, higher frequency data transmission may be accomplished. In example embodiments, an integrated circuit may be endowed with one or more of the disclosed components and may be employed to perform one or more methods as disclosed herein.

Figure 1:
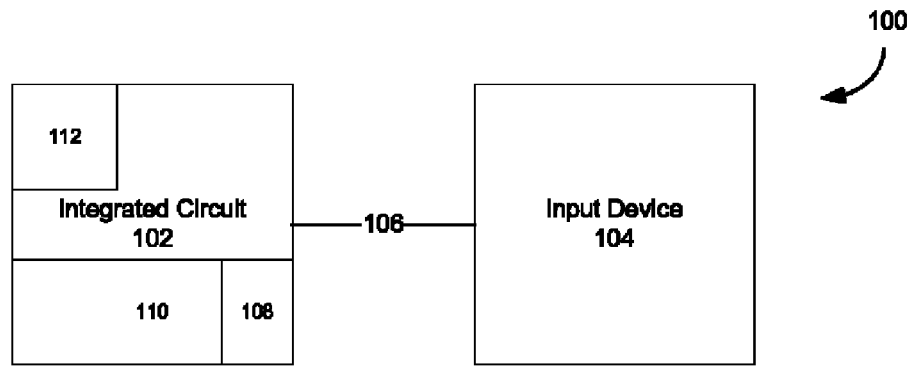
FIG. 1 illustrates a block diagram of voltage protection system in accordance with various embodiments.

FIG. 1 illustrates a block diagram of a voltage protection system 100, in accordance with various embodiments. As illustrated, the system 100 may include an integrated circuit 102 comprising a multiplexing module 108, an output driver 110, logic circuitry 112, and an output interface. The integrated circuit 102 may be coupled to an input device 104 via an output interface of the output driver 110. In various embodiments, the input device 104 may be coupled to the interface via a channel 106. The channel 106 may be a transmission line as the input device 104 and output driver 110 operate at high frequency.

In various embodiments, the input device 104 may be a device driven by the output driver 110. The input device 104 may be a memory module such as a Graphics Double Data Rate, version 5 ("GDDR5") module (see JEDEC Standard no. 8-20A, October 2009). The input device 104 may be configured to operate at an operational voltage and a data transfer rate. In the example of the GDDR5 module, the operational voltage may be approximately 1.5 volts and the data rate may be approximately 5 GB/s.

In various embodiments, output driver 110 may be embodied in an integrated circuit 102 along with logic circuitry 112. The output driver 110 may include one or more output driver transistors (see FIG. 2) that have a high voltage threshold that is below the operational voltage of the input device 104. For example, the high voltage threshold may be 1.15 volts, in accordance with the 45 nm process. As a consequence of the disparity in voltages, the output driver 110 may include a protection transistor (see FIG. 2) coupled to the one or more output driver transistors. The protection transistor may be configured to lower the voltage across the one or more output driver transistors. For example, the protection transistor may be biased with an appropriate gate voltage to lower the voltage across $V_{gd}$ and/or $V_{gs}$ to at least the high voltage threshold associated with the output driver transistors.

Utilizing protection transistors may prevent EOS damage, but in various embodiments, may also serve to increase output capacitance seen by the output driver 110. This may have an impact on the operating frequency of the output driver 110. For example, the output driver data pin may have an associated time constant related to its resistance and capacitance, an RC time constant. Because the resistance is determined based upon a number of factors including load balancing, capacitance may be the only variable for altering the time constant. Adding capacitance increases the time constant and may limit the ability of the output driver to function at high frequency.

To reduce capacitance of the output driver 110, the protection transistors may be biased so that they continually operate in a saturation region. When a transistor operates in a saturation region, the resistive channel between its source and drain may be "pinched-off." Consequently, this pinch-off region shields its channel from its drain and the output capacitance looking into the drain of the transistor may be reduced. Referring again to FIG. 1, the output driver 110 may include a multiplexing module 108 coupled to the protection transistor. The multiplexing module 108 may be configured to bias the protection transistor with one of a first gate voltage or a second gate voltage to maintain the protection transistor in a saturation region.

Figure 2:
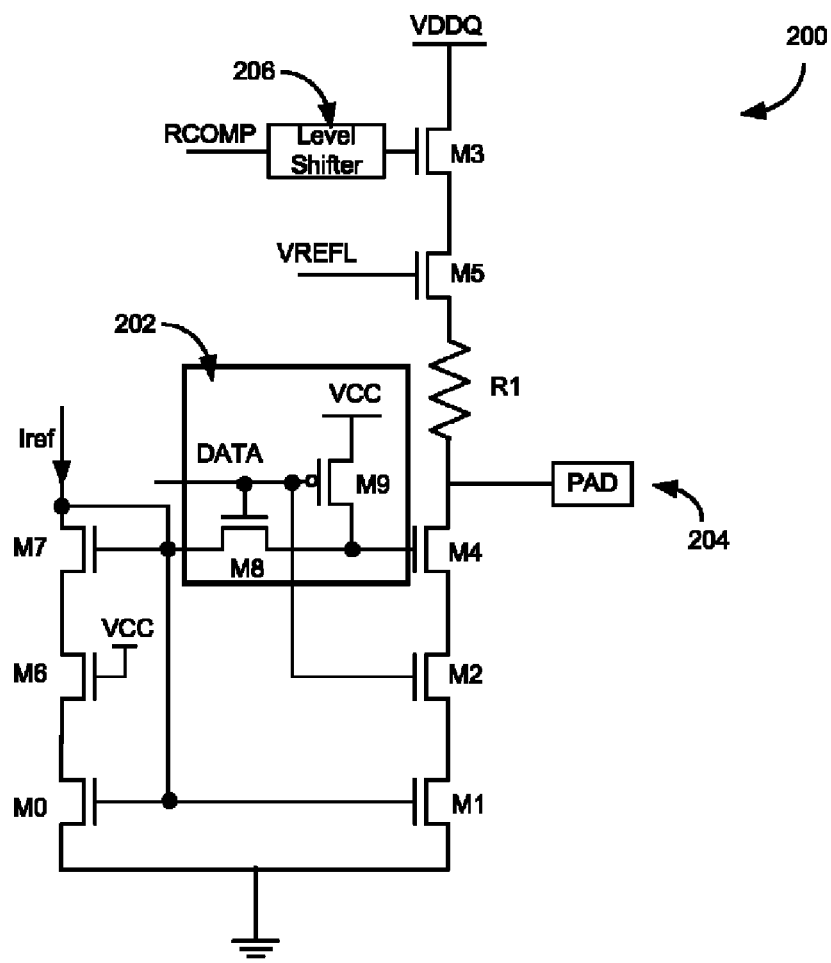
FIG. 2 schematically illustrates an output driver in accordance with various embodiments.

Referring now to FIG. 2, a schematic diagram of an output driver 200 is illustrated in accordance with various embodiments. The output driver 200 may include an output interface 204, one or more protection transistors M4 and M5, and a switching module 202, coupled to each other as shown. The output driver 200 may include more or fewer components without deviating from the scope of the disclosure. For example, the output driver may also include a level shifter 206, a resistor R1, and transistors M0-M3, M6-M9, coupled to each other and the earlier enumerated elements as shown. The output driver 200 may be coupled to logic circuitry and configured to drive an output via the output interface 204. The integrated circuit may include CMOS transistors including both P-type or N-type transistors, however, the disclosure is not so limited.

In various embodiments, one or more protection transistors, for example M4 and M5 may be coupled between the output interface 204 and output driver transistors M2 and M3 to protect the output driver 300 from damage, for example electrical overstress damage. The protection transistor M4 may be coupled to the output interface 204 and configured to operate in a protection mode or a current mirror mode, as will be discussed in more detail herein. While operating in one or more of the various modes, the gate of the protection transistor M4 may be biased in a manner that maintains the protection transistor M4 in a saturation region.

Still referring to FIG. 2, a switching module 202, may be coupled to a protection transistor, for example M4. The switching module 202 may include at least one PMOS transistor M9 and at least one NMOS transistor M8. Both transistors M8 and M9 may have their gates tied to a data input to receive a data signal, and consequently, may alternate operation based upon whether the data signal includes a high voltage or a low voltage. As illustrated in FIG. 2, transistor M9 may have its source coupled to $V_{CC}$ and its drain coupled to the gate of M4. Transistor M8 may have its source coupled to a gate of transistor M7 and its drain coupled to the gate of M4. Consequently, the switching module 202 may be coupled to the gate of M4 and configured to switch its gate voltage between two or more values.

In various embodiments, switching the gate of protection transistor M4 from a first value to a second value may switch the protection transistor M4 between a protection mode and a current mirror mode. Switching module 202 may be configured to switch the protection transistor M4 between the protection mode and the current mirror mode based on a data signal to be output via the output interface 204. For example, when the data signal is low, the switching module 202 may bias protection transistor M4 such that it operates in a protection mode. Alternatively, when the data signal is high, the switching module may bias the protection transistor M4 such that it operates in a current mirror mode. In both the current mirror mode and the protection mode, the protection transistor M4 may operate in its saturation region.

In various embodiments, while operating in a protection mode, the output driver 200 may be pulling up and the pull-down current mirror may be turned off. While operating in a current mirror protection mode, the output may be pulled down via the pull-down current mirror. While in the current mirror function, the protection transistor may increase the equivalent current mirror transistor channel length, which may facilitate operating the transistor in a saturation region.

Figure 3:
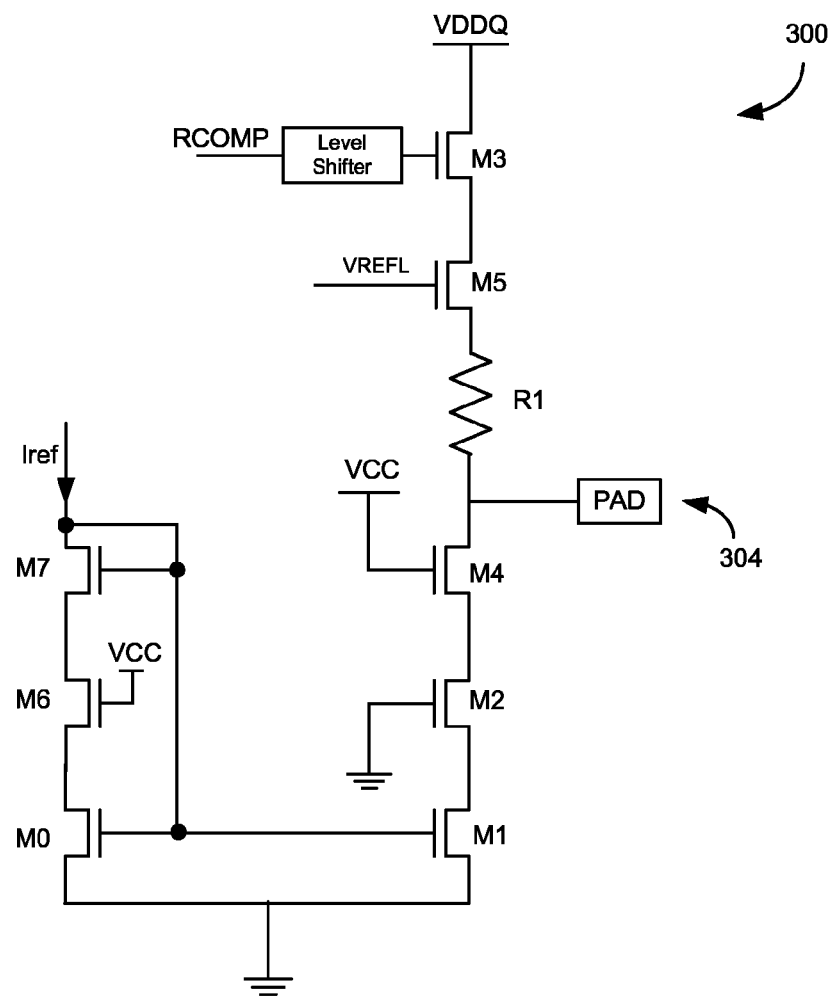
FIG. 3 schematically illustrates a similar circuit of an output driver in accordance with various embodiments.

Referring now to FIG. 3, a similar circuit of FIG. 2 when the input data is low is illustrated, in accordance with various embodiments. When the data input or data signal is low, the protection transistor M4 may operate in a protection mode. The switching module 202 may operate the protection transistor M4 in the protection mode by switching the gate of the protection transistor to an appropriate voltage. The voltage may maintain the protection transistor in its saturation region.

As illustrated in FIG. 3, when the data signal is low, the PMOS switch M9 may be turned on and the gate of transistor M4 may be switched to a voltage, for example $V_{CC}$. In addition to turning on the PMOS switch, the low data signal may have the opposite effect on the NMOS switch M8. That is, the low data signal may turn off the NMOS switch M8, which may effectively decouple the gate of M4 from the current mirror comprising transistors M7, M6, and M0. Additionally, the gate of M2 may also be pulled low due to its direct coupling to the input data line.

Still referring to FIG. 3, as M2 is turned off, the current source or current mirror may also be turned off. Consequently, the PAD voltage at output 304 may be pulled up through resistor R1 and transistor M3. Because the switching module 202 may be switching transistor M4 into a protection mode, the gate of transistor M4 may be tied to $V_{CC}$ to protect M4 from EOS damage. Consequently, the gate-to-drain voltage of M4 may effectively be the difference between the output voltage and $V_{CC}$. Because $V_{CC}$ may be dynamically coupled to the gate, transistor M4 may protect the output driver from EOS damage, but remain in a saturation region. In this embodiment, M4 may function as an EOS protection transistor.

Figure 4:
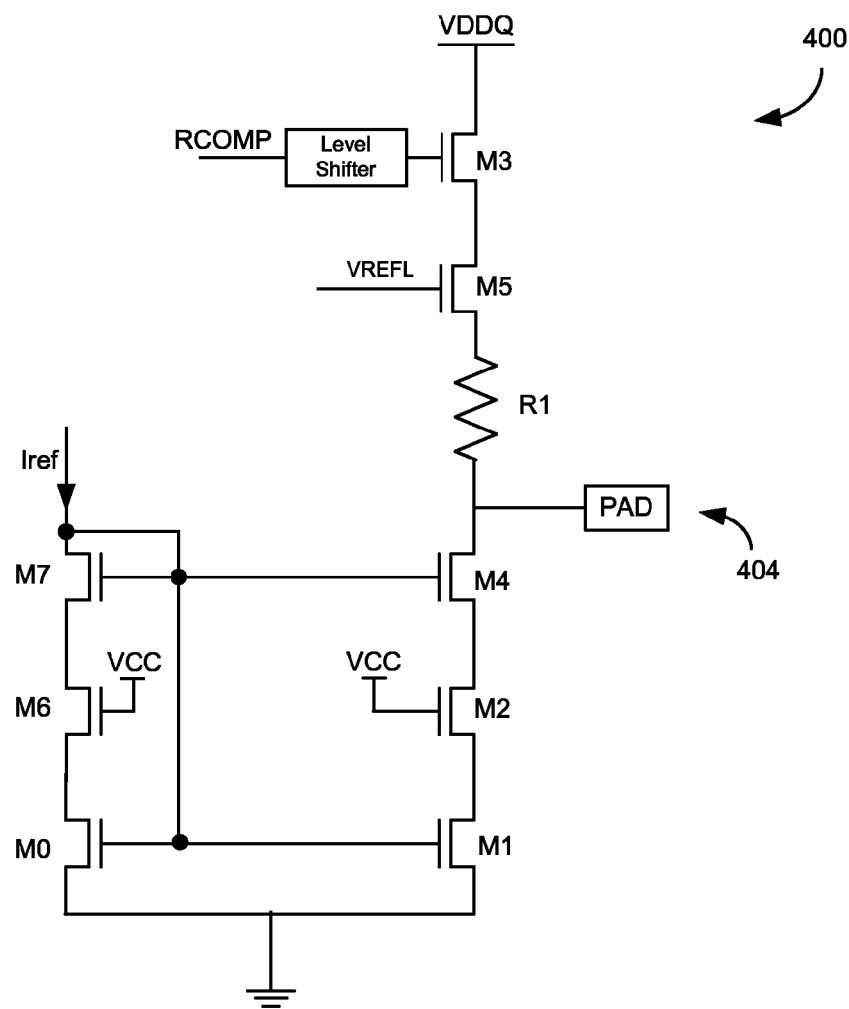
FIG. 4 schematically illustrates another similar circuit of an output driver in accordance with various embodiments.

Referring to FIG. 4, another similar circuit of FIG. 2 when the data signal is high is illustrated, in accordance with various embodiments. When the data signal is high, the protection transistor may function in a current mirror mode. The switching module 202 may operate the protection transistor in the current mirror mode by switching the gate of the protection transistor to a second voltage. In various embodiments, the second voltage may bias the transistor M4 so that it may operate in a saturation region.

As illustrated in FIG. 4, when the data signal has a high voltage, the PMOS switch M9 may be turned off. This may effectively decouple the gate of protection transistor M4 from $V_{CC}$. Additionally, the high data signal may turn on the NMOS switch M8. Consequently, the gate of M4 may be coupled to the current source. Additionally, because the gate of M2 may also be coupled to the data signal, as illustrated in FIG. 2, when the data signal is high, for example $V_{CC}$, M2 may be turned on. As M2 is turned on, the current source may also be turned on. With the current source on, the PAD voltage at output 404 may be pulled down through the current source. Furthermore, because protection transistor M4 may no longer be operatively coupled to $V_{CC}$, transistor M4 may continue operating in a saturation region, thus reducing its capacitance.

As seen from FIGS. 3 and 4, the protection transistor may be appropriately biased such that it may continually operate in a saturation region. In various embodiments, a determination of the biasing may be based on the data signal to be output via the output driver.

Figure 5:
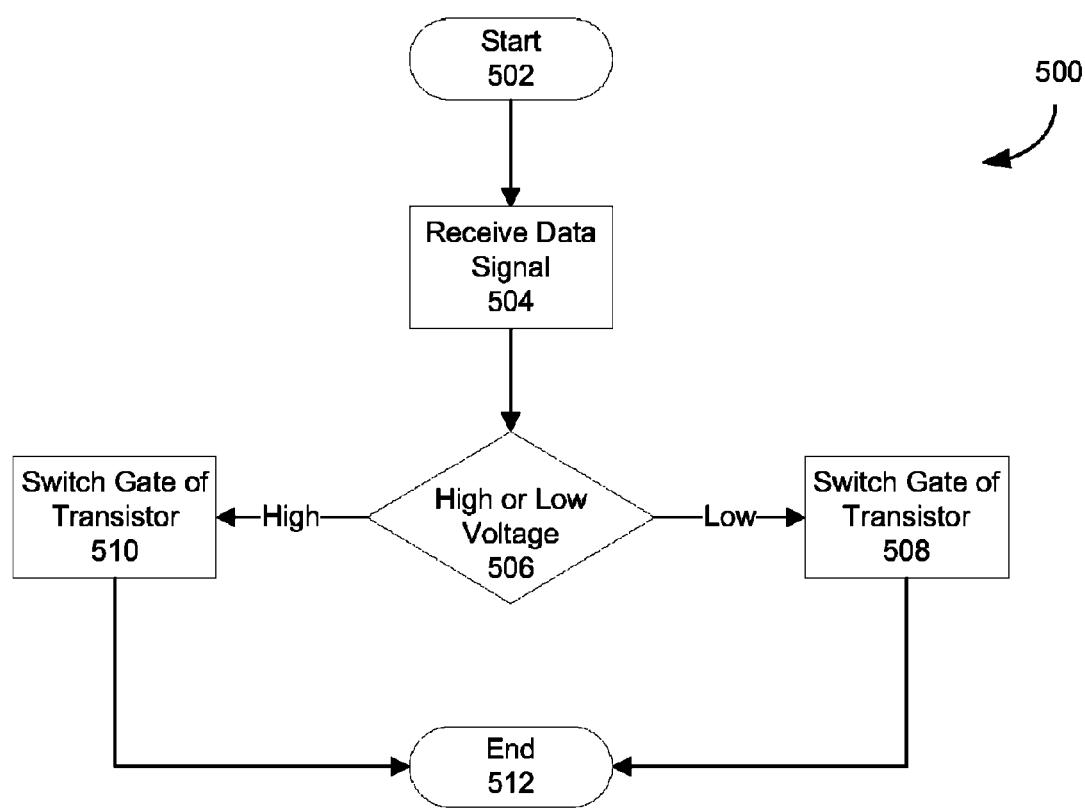
FIG. 5 is a flow chart for performing a method in accordance with various embodiments.

Referring to FIG. 5, a flow chart is illustrated in accordance with various embodiments. The process 500 may include some or all of the processes described below. In some embodiments, some of the processes illustrated may be optional. Furthermore, FIG. 5 is not meant to limit the processes to any particular order. Rather, FIG. 5 is merely included for ease of understanding and to illustrate one possible embodiment disclosed herein.

The process may begin at block 502 and progress to block 504. At block 504 a switching module of an output driver, for example an output driver as described with reference to FIG. 1 or 2, may receive a data signal to be output via an output interface of the output driver. In various embodiments the data signal may be a digital signal including a series of "1s" and "0s" represented by high and low voltages, respectively.

Upon the switching module receiving the data signal, the process may proceed to block 506, where a determination is made as to whether the data signal is currently a high voltage or a low voltage. If the data signal is a low voltage, the process may continue to block 508. If the data signal is a high voltage, the process may continue to block 510.

At block 508, the switching module may switch the gate of the protection transistor from a first voltage to a second voltage based at least in part on the data signal to maintain the protection transistor in a saturation region while the output interface outputs the data signal. In various embodiments, the switching module may switch the gate of the protection module from a low voltage to a high voltage, $V_{CC}$, by biasing, via a first switch, the gate of the protection transistor with a high voltage. In various embodiments, the first switch may be a PMOS switch and the high voltage may be a protection voltage that prevents $V_{gd}$ and $V_{gs}$ of the transistor M4 from exceeding a high voltage threshold.

Returning to Block 506, if the data signal is a high voltage, the process may proceed to block 510. At block 510, the switching module may switch the gate of the protection transistor from a first voltage to a second voltage based at least in part on the data signal to maintain the protection transistor in a saturation region while the output interface outputs the data signal. In various embodiments the switching module may switch the gate of the protection module from a high voltage to a low voltage, by biasing, via a second switch, the gate of the protection transistor with the low voltage. In various embodiments, the second switch may be a NMOS switch, which when turned on ties the gate of the protection transistor to a current mirror as illustrated in FIG. 4.

From block 508 or block 510, the process may continue to block 512 where the process may end. Alternatively, the process may proceed back to start block 502 and begin again. In this manner, the output driver may continuously maintain the protection transistor in a saturation region irregardless of whether it is functioning in a protection mode or a current mirror mode.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. An integrated circuit, comprising:
   logic circuitry; and
   an output driver coupled to the logic circuitry, wherein the output driver includes:
      an output interface configured to drive an input;
      a protection transistor coupled to the output interface and configured to operate in a protection mode or a current mirror mode; and
      a switching module coupled to the protection transistor and configured to switch the protection transistor between the protection mode and the current mirror mode, based on a data signal to be output via the output interface.

2. The integrated circuit of claim 1, wherein the protection transistor is further configured to provide electrical overstress protection to the output driver.

3. The integrated circuit of claim 1, wherein the protection transistor is further configured to operate in a saturation region.

4. The integrated circuit of claim 1, wherein the switching module comprises at least a PMOS transistor and an NMOS transistor.

5. The integrated circuit of claim 1, wherein the protection transistor is configured to operate in the protection mode when the data signal is low.

6. The integrated circuit of claim 1, wherein the protection transistor is configured to operate in the current mirror mode when the data signal is high.

7. The integrated circuit of claim 1, wherein the switching module is coupled to a gate of the protection transistor and configured to switch its gate voltage.

8. A method comprising:
   receiving, by a switching module of an output driver of an integrated circuit, a data signal to be output via an output interface of the output driver; and
   switching, by the switching module of the output driver, a gate of a protection transistor of the output driver from a first voltage to a second voltage based at least in part on the data signal to maintain the protection transistor in a saturation region while the output interface outputs the data signal.

9. The method of claim 8, wherein switching the gate of the protection transistor comprises biasing, via a first switch, the gate of the protection transistor with the first voltage.

10. The method of claim 9, wherein, biasing, via the first switch, the gate of the protection transistor comprises switching the gate of the protection transistor to a protection voltage via a PMOS switch.

11. The method of claim 9, wherein, biasing, via the first switch, the gate of the protection transistor comprises switching the gate of the protection transistor to a protection voltage, wherein the protection voltage prevents a gate to drain voltage of the protection transistor from exceeding a threshold.

12. The method of claim 8, wherein switching the gate of the protection transistor comprises biasing, via a second switch the gate of the protection transistor with the second voltage.

13. The method of claim 12, wherein biasing, via the second switch, the gate of the protection module comprises switching the gate of the protection transistor to a current mirror via an NMOS switch.

14. A system comprising:
a memory module configured to operate at a voltage;
an IC coupled to the memory module, wherein the IC includes an output driver comprising:
one or more output driver transistors, wherein the one or more output driver transistors have a high voltage threshold that is below the voltage of the memory module;
a protection transistor coupled to the one or more output driver transistors and configured to operate in a protection mode or a current mirror mode to lower the voltage across one or more of the one or more output driver transistors to at least the threshold voltage; and
a multiplexing module coupled to the protection transistor and configured to switch the protection transistor from the current mirror mode to the protection mode based on output data.

15. The system of claim 14, wherein the protection transistor is configured to provide electrical overstress protection to the one or more output driver transistors.

16. The system of claim 14, wherein the multiplexing module comprises a PMOS transistor and an NMOS transistor.

17. The system of claim 14, wherein multiplexing module is configured to switch the protection transistor to the protection mode when input data is low.

18. The system of claim 14, wherein multiplexing module is further configured to switch the protection transistor from the protection mode to the current mirror mode when input data transitions from low to high.

19. The system of claim 14, wherein the high voltage threshold is about 1.15 volts.

20. The system of claim 14, wherein the memory module is a Graphics Double Data Rate, version 5 device.

* * * * *